United States Patent
Hagiwara

(10) Patent No.: US 12,278,443 B2
(45) Date of Patent: Apr. 15, 2025

(54) CONTACT PIN AND SOCKET

(71) Applicant: Enplas Corporation, Saitama (JP)

(72) Inventor: Yoshinobu Hagiwara, Saitama (JP)

(73) Assignee: Enplas Corporation, Saitama (JP)

( * ) Notice: Subject to any disclaimer, the term of this patent is extended or adjusted under 35 U.S.C. 154(b) by 356 days.

(21) Appl. No.: 17/797,115

(22) PCT Filed: Dec. 17, 2020

(86) PCT No.: PCT/JP2020/047271
§ 371 (c)(1),
(2) Date: Aug. 3, 2022

(87) PCT Pub. No.: WO2021/161654
PCT Pub. Date: Aug. 19, 2021

(65) Prior Publication Data
US 2023/0058577 A1   Feb. 23, 2023

(30) Foreign Application Priority Data
Feb. 12, 2020   (JP) .................................. 2020-021595

(51) Int. Cl.
*H01R 13/24* (2006.01)
*G01R 1/04* (2006.01)
*H01R 12/71* (2011.01)

(52) U.S. Cl.
CPC ....... *H01R 13/2421* (2013.01); *G01R 1/0441* (2013.01); *H01R 12/714* (2013.01); *H01R 2201/20* (2013.01)

(58) Field of Classification Search
CPC .............. H01R 13/2421; H01R 12/714; H01R 2201/20; G01R 1/0441; G01R 1/06722; G01R 1/0466
See application file for complete search history.

(56) References Cited

U.S. PATENT DOCUMENTS

| | | | | |
|---|---|---|---|---|
| 5,576,631 | A * | 11/1996 | Stowers | H01R 13/2421 |
| | | | | 324/755.05 |
| 6,020,635 | A * | 2/2000 | Murphy | H01R 13/2421 |
| | | | | 257/727 |
| 9,748,680 | B1 * | 8/2017 | Huang | H01R 12/714 |
| 2006/0052011 | A1 | 3/2006 | Goodman et al. | |
| 2019/0346483 | A1 | 11/2019 | Nakashima | |
| 2020/0203873 | A1 * | 6/2020 | Wang | H01R 24/38 |

FOREIGN PATENT DOCUMENTS

| | | |
|---|---|---|
| JP | 2016-217910 | 12/2016 |
| JP | 2019-138658 | 8/2019 |
| JP | 2019-196937 | 11/2019 |

* cited by examiner

*Primary Examiner* — Michael C Zarroli

(57) ABSTRACT

This contact pin electrically connects a first electrical component and a second electrical component, the contact pin comprising: a pin body having an inside pin element and an outside pin element combined to be extendable; an elastic member that energizes the inside pin element and the outside pin element in the direction in which the pin body expands when the pin body is in a contracted state; and a pressing part that is provided on the outside pin element, and that when the pin body contracts, applies force to the inside pin element that moves in a first direction in the axial direction, the force including a component in a second direction orthogonal to the first direction.

9 Claims, 12 Drawing Sheets

CONTACT PIN AND SOCKET

TECHNICAL FIELD

The present invention relates to a contact pin and a socket used for performance testing of an electric component, such as a semiconductor device (hereinafter referred to as "IC package").

BACKGROUND ART

A conventional IC socket (hereinafter, simply referred to as "socket"), for example, is known as a socket configured to house an electric component, such as an IC package, for electrically connecting the component with the outside (see, for example, Patent Literature (hereinafter, referred to as PTL) 1). Sockets are used to inspect the electrical characteristics of electronic components during the inspection of the components for shipping.

Such a socket includes a plurality of contact pins that electrically connect an electric component with an inspection board located on the inspection device. Each contact pin includes an upper plunger, a lower plunger, and a coil spring.

The upper plunger includes at the upper end thereof a contact part that comes into contact with a terminal of an electric component. The lower plunger includes at the lower end thereof a contact part that comes into contact with a terminal of the inspection board. Such a lower plunger is inserted into the upper plunger so as to be movable with respect to the upper plunger in vertical direction. The coil spring urges the upper plunger and the lower plunger in a direction to be separated from each other.

CITATION LIST

Patent Literature

PTL 1
Japanese Patent Application Laid-Open No. 2019-196937

SUMMARY OF INVENTION

Technical Problem

In a socket as described above, there is a demand for a contact pin structure that can achieve a stable connection between an electric component and an inspection board by bringing the upper plunger and the lower plunger into contact with each other without fail.

An object of the present invention is to provide a contact pin and a socket both capable of stabilizing the connection between a first electric component and a second electric component.

Solution to Problem

A contact pin according to the present invention in one aspect is configured to electrically connect a first electric component with a second electric component, the contact pin includes:
 a pin body including an inner pin element and an outer pin element that are telescopically combined;
 an elastic member configured, in a retracted state of the pin body, to urge the inner pin element and the outer pin element in a direction in which the pin body is extended; and
 a pressing portion provided in the outer pin element and configured, during retraction of the pin body, to apply a force to the inner pin element moving in a first direction in an axial direction of the pin body, the force containing a component in a second direction orthogonal to the first direction.

A socket according to the present invention in one aspect includes:
 the above-described contact pin; and
 a support member including a holding portion for holding the contact pin.

Advantageous Effects of Invention

The present invention can stabilize the connection between a first electric component and a second electric component.

DESCRIPTION OF EMBODIMENTS

Hereinafter, embodiments of the present invention will be described in detail with reference to the drawings. Sockets according to the embodiments described below are merely examples of the sockets according to the present invention, and the present invention is not limited to the embodiments.

Embodiment 1

In the following, socket S and contact pin 2 according to Embodiment 1 of the present invention will be described with reference to FIGS. 1 to 4C.

In the following description, the axial direction refers to the direction parallel to the central axis of contact pin 2 and the members constituting contact pin 2. One side in the axial direction corresponds to the lower side in a used state, and the other side in the axial direction corresponds to the upper side in the used state. The direction from the other side to the one side in the axial direction corresponds to the first direction in the axial direction. The direction from the one side to the other side in the axial direction corresponds to the second direction in the axial direction.

In contact pin 2 and the members constituting contact pin 2, the radial direction (or radially) refers to the radial direction of a circle whose center is the central axis of contact pin 2 and the members constituting contact pin 2.

In contact pin 2 and the members constituting contact pin 2, the circumferential direction refers to the circumferential direction of a circle whose center is the central axis of contact pin 2 and the members constituting contact pin 2.

Socket

Figure 1:
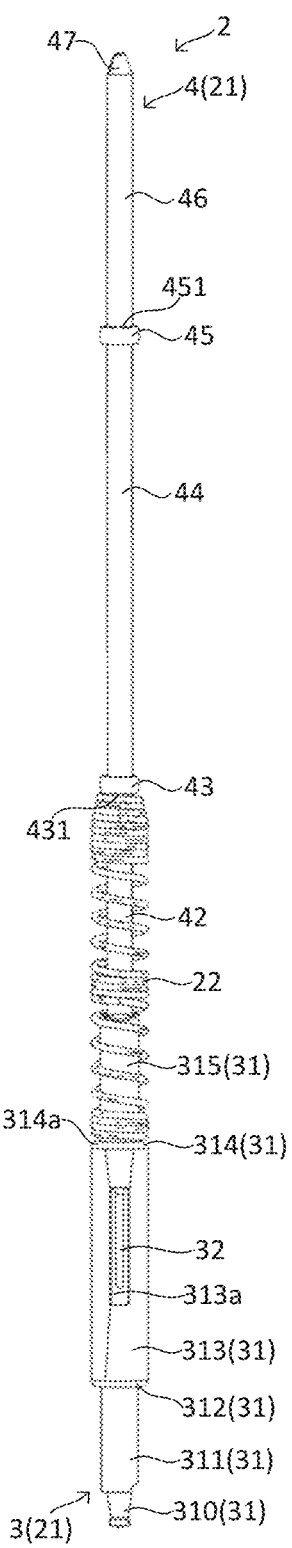
FIG. 1 is a side view of a contact pin according to Embodiment 1 of the present invention.
Figure 2:
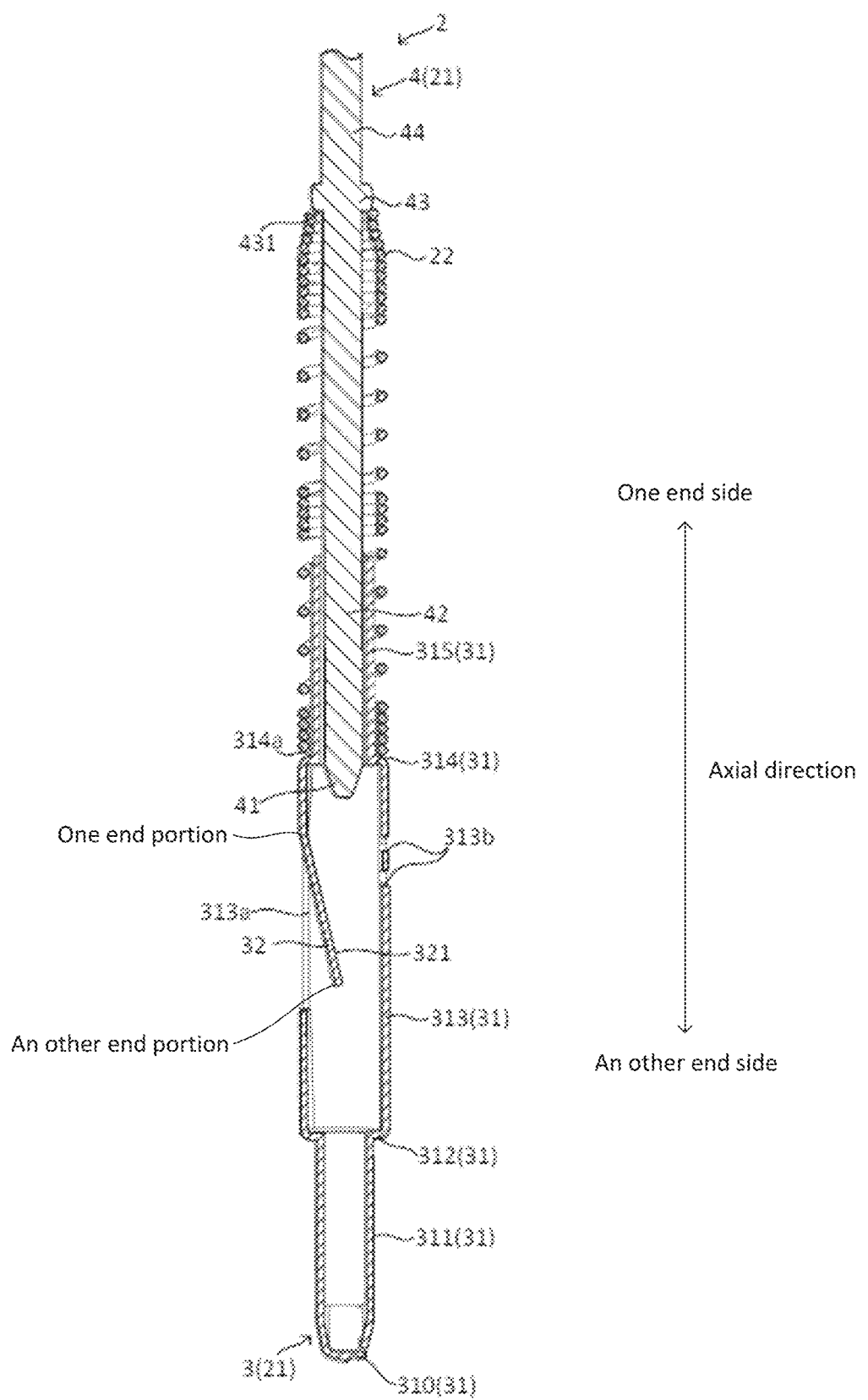
FIG. 2 is a cross-sectional view of the contact pin in a non-used state.
Figure 3:
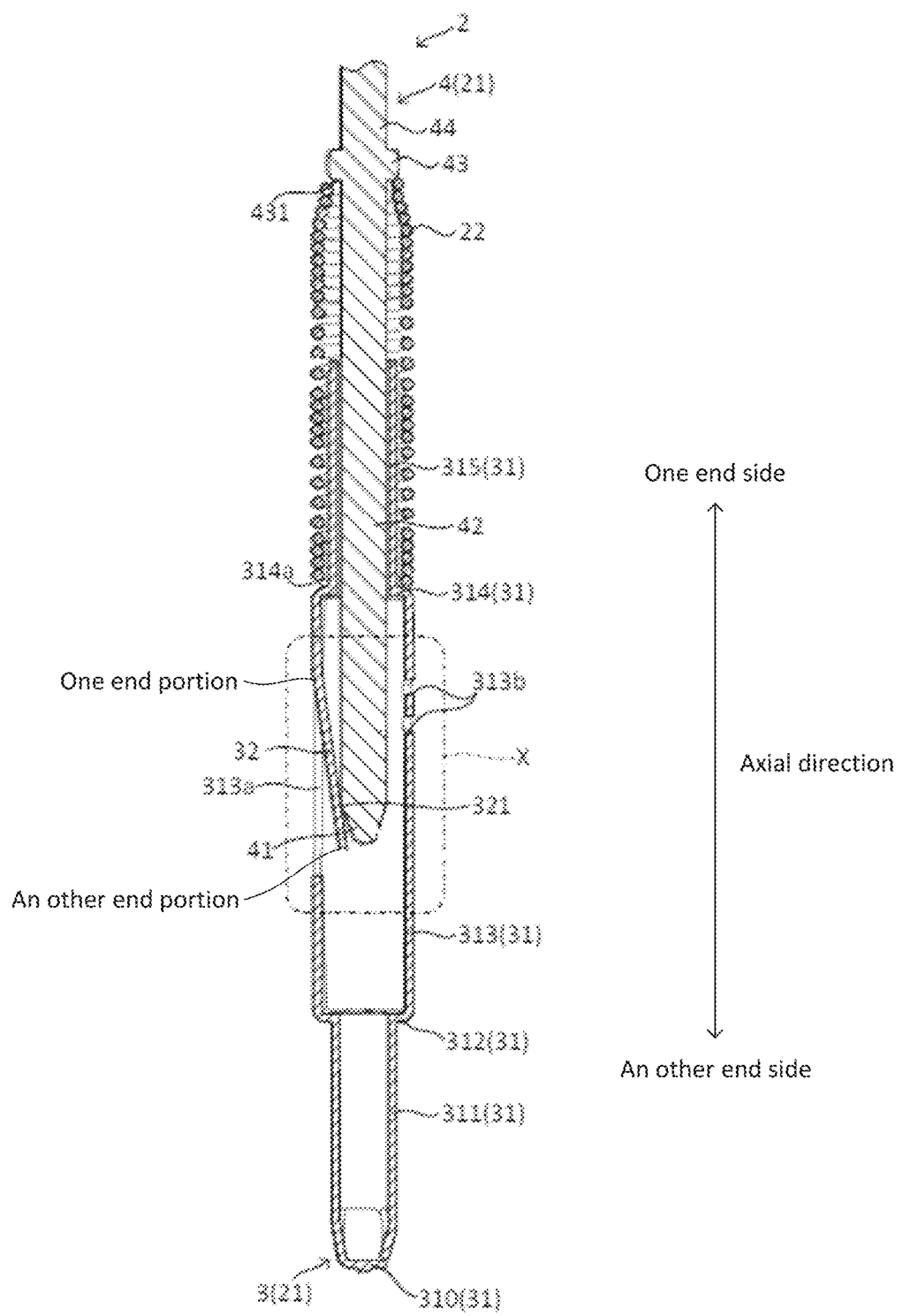
FIG. 3 is a cross-sectional view of the contact pin in a used state.
Figure 4A:
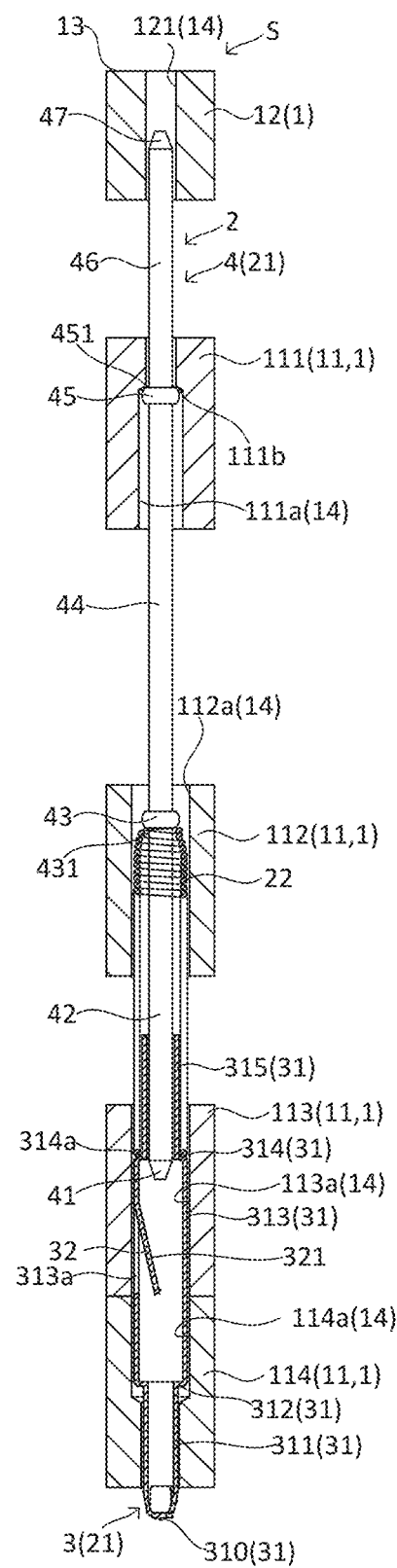
FIG. 4A is a partial cross-sectional view of a socket illustrating a state of the contact pin in the non-used state.
Figure 4B:
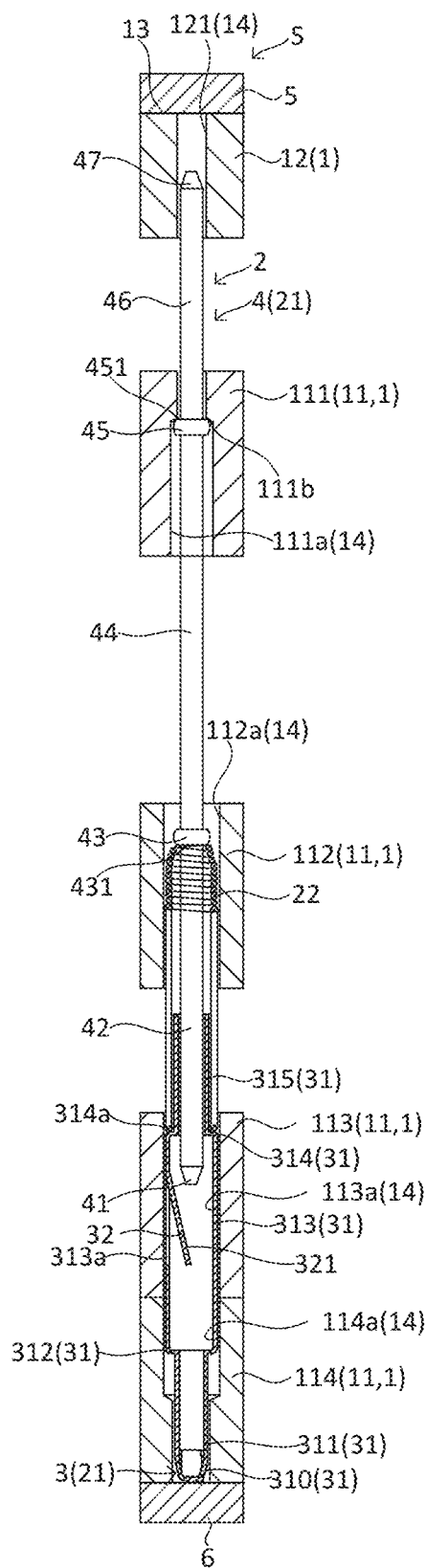
FIG. 4B is a partial cross-sectional view of the socket illustrating a state of the contact pin disposed on an inspection board.
Figure 4C:
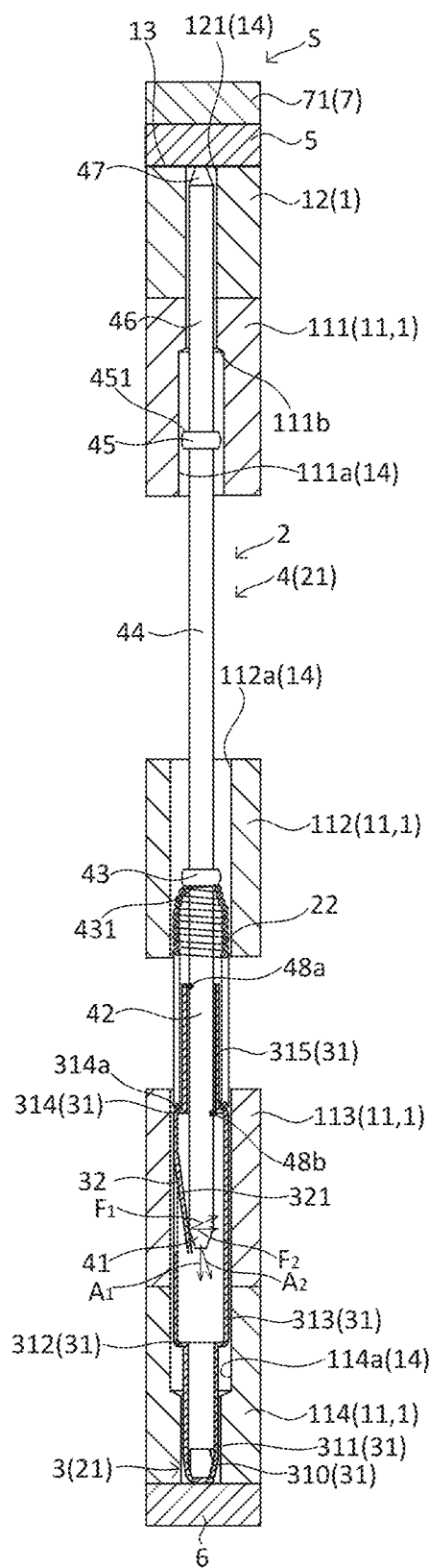
FIG. 4C is a partial cross-sectional view of the socket illustrating a state of the contact pin in the used state.

Socket S is used for inspecting an electric component, such as IC package 5 (see FIG. 4C), as a socket for electrically connecting IC package 5 with inspection board 6 (see FIG. 4C).

In the present embodiment, IC package 5 corresponds to an exemplary first electric component. In addition, inspection board 6 corresponds to an exemplary second electric component.

Alternatively, inspection board 6 may correspond to the exemplary first electric component, and IC package 5 may correspond to the exemplary second electric component.

A plurality of package-side terminals (not illustrated) are provided in a matrix on the lower surface of IC package 5. The package-side terminal is, for example, a solder ball. A plurality of board-side terminals (not illustrated) are provided in a matrix on the upper surface of inspection board 6.

Socket S includes contact pin 2 and support member 1 to be disposed on inspection board 6.

Socket S may be of any type. Socket S may include a housing (although not illustrated) with a housing portion for housing support member 1. Socket S may also include a cover member, which is provided at the housing so as to be openable and closable, for covering the housing portion of the housing from above when the socket is in a used state. In addition, socket S may include a pressing member, which is supported by the cover member, for pressing IC package 5 downward when the socket is in the used state.

Herein, a non-used state of socket S (hereinafter, also simply referred to as "non-used state") refers to a state in which socket S is not disposed on inspection board 6 and IC package 5 is not housed in socket S, as illustrated in FIG. 4A. A state in which socket S is not disposed on inspection board 6 and IC package 5 housed in socket S is not pressed by, for example, a pressing member may also be considered as a non-used state of socket S.

A used state of socket S (hereinafter, also simply referred to as "used state") refers to a state of socket S illustrated in FIG. 4C (the same state as of a socket during the inspection of an electric component). In other words, a used state of socket S refers to a state in which socket S is disposed on inspection board 6 and IC package 5 housed in socket S is pressed downward by, for example, pressing member 71 (see FIG. 4C) of pressing device 7.

Support Member

Support member 1 has, for example, the shape of a rectangular plate. Support member 1 having such a configuration is for supporting contact pin 2. Support member 1 insulates adjacent contact pins 2 from each other. Support member 1 is made of, for example, a synthetic resin. Support member 1 may be made of an elastic material.

Support member 1 includes fixed portion 11, movable portion 12, placement surface 13, and holding portion 14.

Fixed Portion

Fixed portion 11 has the shape of a rectangular plate, and is fixed to the side wall portion (not illustrated) of socket S by a fixing means, such as a fastening component. The side wall portion, for example, has the shape of a rectangular frame and is provided so as to surround support member 1. Thus, fixed portion 11 is immovable with respect to the side wall portion.

Fixed portion 11 is composed of a plurality of plate-shaped members provided so as to face each other in the vertical direction. Specifically, fixed portion 11 includes first plate 111, second plate 112, third plate 113, and fourth plate 114 in this order from the top.

First plate 111, second plate 112, third plate 113, and fourth plate 114 are connected by fastening components, such as bolts, while being separated from each other in the vertical direction. The number of plates constituting fixed portion 11 is not limited to that of the present embodiment. Fixed portion 11 may be composed of one plate.

Movable Portion

Movable portion 12 has the shape of a rectangular plate, and is provided above first plate 111 of fixed portion 11 so as to face fixed portion 11. Movable portion 12 is supported by fixed portion 11 so as to be movable with respect to fixed portion 11 in the vertical direction.

Specifically, movable portion 12 is guided so as to move in the vertical direction by a plurality of guide members (not illustrated). The guide member is fixed to fixed portion 11 (specifically, fourth plate 114), and inserted through fixed portion 11 (specifically, first plate 111, second plate 112, and third plate 113) and movable portion 12.

A plurality of elastic members (not illustrated), such as coil springs, are provided between movable portion 12 and fixed portion 11. The elastic member is in a free state in a non-used state of the socket (also referred to as a non-pressed state of the socket). When IC package 5 is pressed downward by pressing member 71 (see FIG. 4C), the elastic member contracts and movable portion 12 moves downward.

The elastic member applies an upward elastic force to movable portion 12 in the used state of the socket (also referred to as the pressed state of the socket). When the pressure on IC package 5 by the pressing member is released, the elastic member stretches, thereby moving movable portion 12 upward.

In the present embodiment, movable portion 12 is referred to as a movable portion for convenience of explanation; however, this portion may be fixed to fixed portion 11 and thus does not move. The upper end of contact pin 2 described below projects upward from movable portion 12 in this case. Contact pin 2 switches its state between a used state and a non-used state according to its own extension and retraction.

Placement Surface

Placement surface 13 is composed of the upper surface of movable portion 12. In the used state, IC package 5 is placed on placement surface 13.

Holding Portion

Holding portion 14 is configured to hold contact pin 2. Support member 1 includes a plurality of holding portions 14. In the present embodiment, holding portion 14 is a through hole that passes through support member 1 in the thickness direction (vertical direction).

Specifically, holding portion 14 includes through hole 121 provided in movable portion 12, through hole 111a provided in first plate 111, through hole 112a provided in second plate 112, through hole 113a provided in third plate 113, and through hole 114a provided in fourth plate 114 in this order from the top.

Through hole 121, through hole 111a, through hole 112a, through hole 113a, and through hole 114a face each other in the vertical direction. Through hole 111a includes, at an intermediate portion in the axial direction, ring-shaped receiving surface 111b (see FIGS. 4A to 4C) facing downward.

The location where holding portion 14 is disposed is appropriately determined according to the locations where the package-side terminal of IC package 5 and the board-side terminal of inspection board 6 are disposed. Contact pin 2 is inserted through holding portion 14 having such a configuration.

Contact Pin

Contact pin 2 includes pin body 21 and elastic member 22. In the description for contact pin 2 and the members constituting contact pin 2 that follows, the end (lower end in the present embodiment) on the first direction side (lower side in the present embodiment) in the axial direction is referred to as the first end, and the end (upper end in the present embodiment) on the second direction side (upper side in the present embodiment) in the axial direction is referred to as the second end.

Pin Body

Pin body 21 includes first pin element 3 and second pin element 4 that are telescopically combined (i.e., first pin element 3 and second pin element 4 that are combined to allow the extension and retraction of the pin body).

First Pin Element

First pin element 3 corresponds to an exemplary outer pin element, and is made of a metal to give conductivity to the entire element. First pin element 3 includes main body portion 31 and pressing portion 32.

Main Body Portion

Main body portion 31 has a cylindrical shape. Main body portion 31 includes first terminal portion 310, first small diameter cylinder portion 311, first connection portion 312, large diameter cylinder portion 313, second connection portion 314, and second small diameter cylinder portion 315 in this order from the first end (lower end) side.

First Terminal Portion

First terminal portion 310 comes into contact with the board-side terminal of inspection board 6 in the used state. First terminal portion 310 projects downward from the lower surface of support member 1 in the non-used state illustrated in FIG. 4A.

First Small Diameter Cylinder Portion

First small diameter cylindrical portion 311 has a cylindrical shape extending in the axial direction. The lower end of first small diameter cylinder portion 311 is connected to the upper end of first terminal portion 310. The upper end of first small diameter cylinder portion 311 is connected to first connection portion 312.

First Connection Portion

First connection portion 312 has the shape of a ring, and connects first small diameter cylinder portion 311 with large diameter cylinder portion 313. The radially inner end in first connecting portion 312 is connected to the upper end of first small diameter cylinder portion 311. The radially outer end in first connecting portion 312 is connected to the lower end of large diameter cylinder portion 313.

Large Diameter Cylinder Portion

Large diameter cylinder portion 313 has a cylindrical shape extending in the axial direction. The lower end of large diameter cylinder portion 313 is connected to first connection portion 312. The upper end of large diameter cylinder portion 313 is connected to second connection portion 314 described below.

Large diameter cylinder portion 313 includes U-shaped slit 313a in the intermediate portion in the axial direction. The ends of slits 313a located at its top are separated from each other. The part surrounded by slit 313a is bent toward the inside of large diameter cylinder portion 313 to form pressing portion 32 described below.

Large diameter cylinder portion 313 includes through hole 313b at a position opposite to slit 313a in the circumferential direction. Through hole 313b passes through large diameter cylinder portion 313 in the radial direction. Through hole 313b having such a configuration serves as a path for a plating material when the surface of first pin element 3 is subjected to surface treatment such as plating in the production process of first pin element 3.

In the present embodiment, through hole 313b is provided at a position whose phase in the circumferential direction is deviated by 180° from pressing portion 32 described below. However, the position of through hole 313b is not limited to that of the present embodiment.

Second Connection Portion

Second connection portion 314 has the shape of a ring, and connects large diameter cylinder portion 313 with second small diameter cylinder portion 315 described below. The radially outer end of second connecting portion 314 is connected to the upper end of large diameter cylinder portion 313. The radially inner end of second connecting portion 314 is connected to the lower end of second small diameter cylinder portion 315.

Second connection portion 314 includes ring-shaped lower receiving surface 314a on its upper surface. Lower receiving surface 314a is in contact with the lower end of elastic member 22 described below. Lower receiving surface 314a is for receiving a downward elastic force applied from elastic member 22. Lower receiving surface 314a corresponds to an exemplary outer receiving surface.

Second small diameter cylindrical portion 315 has a cylindrical shape extending in the axial direction. The lower end of second small diameter cylinder portion 315 is connected to second connection portion 314. The upper end of second small diameter cylinder portion 315 is not connected to any other part. In the present embodiment, large diameter cylinder portion 313 and second small diameter cylinder portion 315 correspond to an exemplary cylinder portion.

Pressing Portion

Pressing portion 32 is provided between first pin element 3 and second pin element 4. Pressing portion 32 is for applying a force—containing a component in the direction orthogonal to the axial direction of contact pin 2—to second pin element 4 moving in the first direction (downward) in the axial direction, during the retraction of contact pin 2. The direction orthogonal to the axial direction of contact pin 2 corresponds to an exemplary second direction.

In the present embodiment, pressing portion 32 is configured by bending a part of large diameter cylinder portion 313 surrounded by slit 313a toward the central axis of contact pin 2.

Specifically, pressing portion 32 has the shape of a plate extending linearly in a direction inclined at a predetermined angle with respect to the vertical direction. The upper end of pressing portion 32 is connected to large diameter cylinder portion 313 and is surrounded by the upper end of slit 313a. In addition, the lower end of pressing portion 32 is closer to the central axis of contact pin 2 than the upper end of pressing portion 32 is. In other words, pressing portion 32 is inclined in a direction approaching the central axis of contact pin 2 from the upper end to the lower end of the pressing portion.

Pressing portion 32 includes guide surface 321 on its first surface—an inner surface in the radial direction—(also referred to as an inner surface of pressing portion 32). Guide surface 321 is, during the retraction of contact pin 2, for guiding second pin element 4 in the direction along guide surface 321 by contacting second pin element 4 moving downward.

Guide surface 321 is an inclined surface inclined in a direction approaching the central axis of contact pin 2 from the upper end to the lower end of the guide surface.

In the present embodiment, pressing portion 32 is formed integrally with large diameter cylinder portion 313. That is, pressing portion 32 and large diameter cylinder portion 313 are formed from one article. Alternatively, the pressing portion may be made of a member different from large diameter cylinder portion 313. In this case, the pressing portion may be fixed on the inner peripheral surface of large diameter cylinder portion 313 at a predetermined position by a fixing means such as adhesion or a fastening component (such as a pin).

In the present embodiment, the number of pressing portion 32 is one. However, the number of pressing portions 32 may be two or more. For example, when the pressing portion is composed of a first pressing portion and a second pressing portion, the first pressing portion and the second pressing portion may be provided so as to be adjacent to each other in the circumferential direction. Specifically, the first pressing portion and the second pressing portion may be provided on the inner peripheral surface of large diameter cylinder portion 313 with the phases of the pressing portions in the circumferential direction deviated by a predetermined angle (for example, 90°).

Modification 1 of Pressing Portion

Figure 5A:
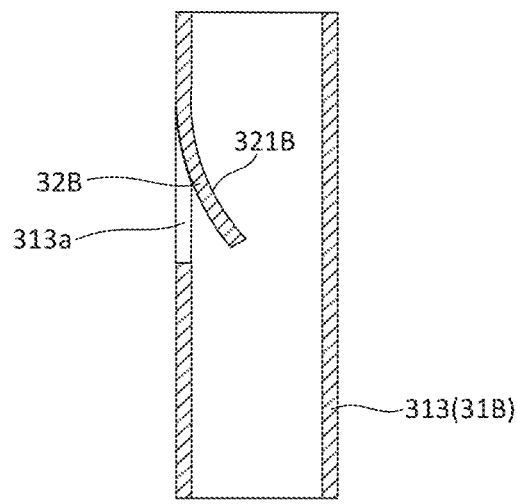
FIG. 5A is a cross-sectional view for explaining Modification 1 of a pressing portion, and corresponds to portion X in FIG. 3.

FIG. 5A is a diagram for explaining Modification 1 of a pressing portion. Pressing portion 32B according to the present modification has the shape of a curved plate in such a way that the radially outer side of the cross-sectional shape of the pressing portion—cut by a plane parallel to the axial direction—is convex. Also in the present modification, the lower end of pressing portion 32B is closer to the central axis of contact pin 2 than the upper end of pressing portion 32B is. In other words, pressing portion 32B is inclined in a curved manner in a direction approaching the central axis of contact pin 2 from the upper end to the lower end of the pressing portion.

Pressing portion 32B includes guide surface 321B on its first surface—an inner surface in the radial direction—(also referred to as an inner surface of pressing portion 32B). Guide surface 321B is a curved surface whose outer side in the radial direction is convex. Guide surface 321B is, during the retraction of contact pin 2, for guiding second pin element 4 in the direction along guide surface 321B by contacting second pin element 4 moving downward.

Modification 2 of Pressing Portion

Figure 5B:
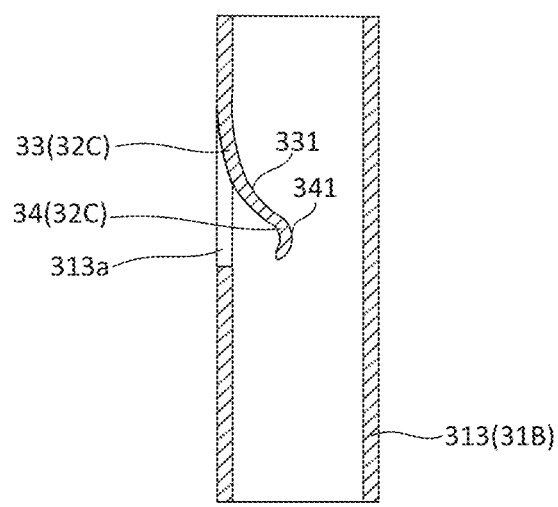
FIG. 5B is a cross-sectional view for explaining Modification 2 of the pressing portion, and corresponds to portion X in FIG. 3.

FIG. 5B is a diagram for explaining Modification 2 of a pressing portion. Pressing portion 32C according to the present modification includes first curved plate portion 33 and second curved plate portion 34.

First curved plate portion 33 has the shape of a curved plate in such a way that the radially outer side of the cross-sectional shape of the curved plate portion—cut by a plane parallel to the axial direction—is convex. The upper end of first curved plate portion 33 is connected to large diameter cylinder portion 313. The lower end of first curved plate portion 33 is connected to the upper end of the second curved plate portion.

The lower end of first curved plate portion 33 is closer to the central axis of contact pin 2 than the upper end of first curved plate portion 33 is. In other words, first curved plate portion 33 is inclined in a curved manner in a direction approaching the central axis of contact pin 2 from the upper end to the lower end of the first curved plate portion.

First curved plate portion 33 includes first guide surface 331 on its first surface—an inner surface in the radial direction—(also referred to as an inner surface of the first curved plate portion). First guide surface 331 is a curved surface whose outer side in the radial direction is convex. First guide surface 331 is, during the retraction of contact pin 2, for guiding second pin element 4 in the direction along first guide surface 331 by contacting second pin element 4 moving downward.

Second curved plate portion 34 has the shape of a curved plate in such a way that the radially inner side of the cross-sectional shape of the curved plate portion—cut by a plane parallel to the axial direction—is convex. The curvature of second curved plate portion 34 is larger than the curvature of first curved plate portion 33. The upper end of second curved plate portion 34 is connected to first curved plate portion 33. Second curved plate portion 34 is smoothly connected to first curved plate portion 33.

Second curved plate portion 34 includes second guide surface 341 on its first surface—an inner surface in the radial direction—(also referred to as an inner surface of second curved plate portion 34). Second guide surface 341 is a curved surface whose inner side in the radial direction is convex. During the retraction of contact pin 2, second guide surface 341 pushes second pin element 4, which moves downward, inward in the radial direction.

Second Pin Element

Second pin element 4 corresponds to an exemplary inner pin element, and is made of a metal to give conductivity to the entire element. Second pin element 4 is inserted into first pin element 3 in a state such that the second pin element is movable in the axial direction with respect to first pin element 3. The upper end of second pin element 4 always protrudes upward from the upper end of first pin element 3.

Specifically, the second pin element includes portion to be pressed (herein also simply referred to as "pressed portion") 41, first shaft portion 42, upper first receiving portion 43, second shaft portion 44, upper second receiving portion 45, third shaft portion 46, and second terminal portion 47 in this order from the first end (lower end) side.

Pressed Portion

Pressed portion 41 has the shape of a truncated cone, and is provided at the lower end of second pin element 4. Pressed portion 41 is disposed inside large diameter cylinder portion 313 of first pin element 3 both in a non-used state and a used state. Specifically, pressed portion 41 has the shape of a truncated cone whose outer diameter becomes smaller toward the bottom.

Pressed portion 41 contacts pressing portion 32 of first pin element 3 when second pin element 4 moves a predetermined distance in the first direction (downward) in the axial direction from the non-used state. The upper end of pressed portion 41 is connected to first shaft portion 42 described below.

First Shaft Portion

First shaft portion 42 has the shape of a shaft extending in the vertical direction. The outer diameter and inner diameter of first shaft portion 42 are both constant over the entire length in the axial direction. The lower end of first shaft portion 42 is connected to pressed portion 41. At least a part of the lower half of first shaft portion 42 is disposed inside second small diameter cylinder portion 315 of first pin element 3 both in the used state and the non-used state. The upper end of first shaft portion 42 is located above the upper end of first pin element 3 both in the used state and the non-used state.

Upper First Receiving Portion

Upper first receiving portion 43 has an outer diameter larger than that of first shaft portion 42. Upper first receiving portion 43 is connected to the upper end of first shaft portion 42. Upper first receiving portion 43 is always located above the upper end of first pin element 3.

Upper first receiving portion 43 includes a ring-shaped upper first receiving surface 431 on its first surface—on the first direction side in the axial direction—(also referred to as a lower surface of upper first receiving portion 43). Upper first receiving surface 431 is in contact with the upper end of elastic member 22 described below. Upper first receiving surface 431 is for receiving an upward elastic force applied from elastic member 22. Upper first receiving surface 431 corresponds to an exemplary inner receiving surface.

Second shaft portion 44 has, for example, the shape of a shaft whose outer diameter and inner diameter do not change over the entire length in the axial direction. The outer diameter of second shaft portion 44 is equal to that of first shaft portion 42. The lower end of second shaft portion 44 is connected to upper first receiving portion 43. Second shaft portion 44 is always located above the upper end of first pin element 3 both in the used state and the non-used state.

Upper second receiving portion 45 has an outer diameter larger than that of second shaft portion 44. Upper second receiving portion 45 is connected to the upper end of second shaft portion 44. Upper second receiving portion 45 is always located above the upper end of first pin element 3.

Upper second receiving portion 45 includes a ring-shaped upper second receiving surface 451 on its first surface—on the second direction side in the axial direction—(also referred to as an upper surface of upper second receiving portion 45). Upper second receiving surface 451 contacts receiving surface 111b of support member 1 in the non-used state.

The contact between upper second receiving surface 451 and receiving surface 111b of support member 1 causes prevention of contact pin 2 from coming off in the upward direction.

Third shaft portion 46 has, for example, the shape of a shaft whose outer diameter and inner diameter do not change over the entire length in the axial direction. The outer diameter of third shaft portion 46 is equal to that of second shaft portion 44. The lower end of third shaft portion 46 is connected to upper second receiving portion 45. Third shaft portion 46 is always located above the upper end of first pin element 3 both in the used state and the non-used state.

Second terminal portion 47 is a part that comes into contact with the package-side terminal of IC package 5 in the used state. Specifically, second terminal portion 47 has the shape of a truncated cone, and is provided at the upper end of second pin element 4.

Specifically, second terminal portion 47 has the shape of a truncated cone whose outer diameter becomes smaller toward the top. Second terminal portion 47 having such a configuration is disposed inside through hole 121 in movable portion 12 of holding portion 14 both in a non-used state and a used state. Second terminal portion 47 is located below the upper surface of support member 1 both in the non-used state and the used state.

Elastic Member

Elastic member 22 is a coil spring, and is provided between first pin element 3 and second pin element 4. Elastic member 22 is for urging first pin element 3 and second pin element 4 in the direction in which pin body 21 is extended.

Specifically, elastic member 22 is provided so as to surround second small diameter cylinder portion 315 of first pin element 3 and first shaft portion 42 of second pin element 4 in a non-used state. The lower end of elastic member 22 is in contact with lower receiving surface 314a in second connection portion 314 of first pin element 3. The upper end of elastic member 22 is in contact with upper first receiving surface 431 in upper first receiving portion 43 of second pin element 4.

In the present embodiment, elastic member 22 is not contracted (that is, at the maximum length) in the non-used state illustrated in FIG. 4A. Elastic member 22 contracts in the state illustrated in FIG. 4B and in the used state illustrated in FIG. 4C. In the contracted state, elastic member 22 applies a force to first pin element 3 and second pin element 4 in a direction in which first pin element 3 and second pin element 4 are separated from each other.

Contact pin 2 having such a configuration is held by holding portion 14 of support member 1. Specifically, in the non-used state, first pin element 3 of contact pin 2 is inserted through both through hole 113a of third plate 113 and through hole 114a of fourth plate 114 in support member 1, as illustrated in FIG. 4A.

In the non-used state, the upper end of first pin element 3 of contact pin 2 is located above through hole 113a of third plate 113.

In the non-used state, the lower end of elastic member 22 is disposed in through hole 113a of third plate 113 in support member 1. In the non-used state, upper first receiving portion 43 of second pin element 4 and the upper end of elastic member 22 are disposed in through hole 112a of second plate 112 in support member 1.

In the non-used state, upper second receiving portion 45 of second pin element 4 is disposed in through hole 111a of first plate 111 in support member 1. Upper second receiving surface 451 in upper second receiving portion 45 of second pin element 4 is in contact with receiving surface 111b in through hole 111a of first plate 111.

Operation of Socket

In the following, the operation of socket S will be described with reference to FIGS. 4A to 4C. FIG. 4A illustrates a state of socket S, corresponding to a non-used state. FIG. 4B illustrates a state of socket S disposed on inspection board 6. FIG. 4C illustrates a state of socket S, corresponding to a used state.

First, socket S in the non-used state as illustrated in FIG. 4A is disposed on inspection board 6. First terminal portion 310 of contact pin 2 is then pushed upward by a board-side terminal (not illustrated) of inspection board 6. As a result, first pin element 3 moves upward despite the elastic force of elastic member 22. Then contact pin 2 is brought into the state illustrated in FIG. 4B.

In the state illustrated in FIG. 4B, pressed portion 41 of second pin element 4 is not in contact with guide surface 321 in pressing portion 32 of first pin element 3.

Next, IC package 5 housed in socket S as illustrated in FIG. 4B is pressed downward by pressing member 71 of pressing device 7. The downward pressing force applied from pressing member 71 causes downward movement of movable portion 12 of support member 1 as well as IC package 5.

Subsequently, second terminal portion 47 of second pin element 4 is pushed downward by the package-side terminal of IC package 5. The downward pressing force applied from IC package 5 then causes downward movement of second pin element 4 (in the direction of arrow $A_1$ in FIG. 4C).

When second pin element 4 moves downward by a predetermined distance, pressed portion 41 of second pin element 4 contacts guide surface 321 in pressing portion 32 of first pin element 3. The direction indicated by arrow $A_1$ in FIG. 4C corresponds to an exemplary first direction in the axial direction.

Guide surface 321 in pressing portion 32 of first pin element 3 is inclined in a direction approaching the central axis of contact pin 2 from the upper end to the lower end of the guide surface. Second pin element 4 thus receives force $F_1$ (see FIG. 4C) in the normal direction of guide surface 321 from pressing portion 32 of first pin element 3.

This force $F_1$ includes force $F_2$ (see FIG. 4C), which is a component of the second direction orthogonal to the first direction in the axial direction. Force $F_2$ causes the change in the moving direction of second pin element 4 from the direction indicated by arrow $A_1$ in FIG. 4C to the direction indicated by arrow $A_2$ in FIG. 4C. As a result, second pin element 4 is inclined at a predetermined angle with respect to first pin element 3. The direction indicated by arrow $A_2$ in FIG. 4C corresponds to an exemplary second direction orthogonal to the first direction in the axial direction.

When second pin element 4 is inclined with respect to first pin element 3, upper contact position 48a and lower contact position 48b (the parts indicated by the black circles in FIG. 4C) in second pin element 4 come into contact with first pin element 3. Then socket S is brought into the used state illustrated in FIG. 4C.

Specifically, in the used state, upper contact position 48a comes into contact with the upper end of second small diameter cylinder portion 315 in first pin element 3. In addition, in the used state, lower contact position 48b comes into contact with the lower end of second small diameter cylinder portion 315 in first pin element 3.

In the present embodiment, upper contact position 48a and lower contact position 48b are provided at first shaft portion 42 of second pin element 4. Upper contact position 48a is located above lower contact position 48b in first shaft portion 42 of second pin element 4. The phases of upper contact position 48a and lower contact position 48b are deviated from each other by 180° in the circumferential direction.

Effects

In the present embodiment with the configuration described above, second pin element 4 is inclined with respect to first pin element 3 during the retraction of contact pin 2. Upper contact position 48a and lower contact position 48b (the parts indicated by the black circles in FIG. 4C) in second pin element 4 thus come into contact with first pin element 3. Therefore, first pin element 3 and second pin element 4 are connected to each other without fail. The configuration thus can stabilize the electrical connection between IC package 5 and inspection board 6.

Embodiment 2

Figure 6:
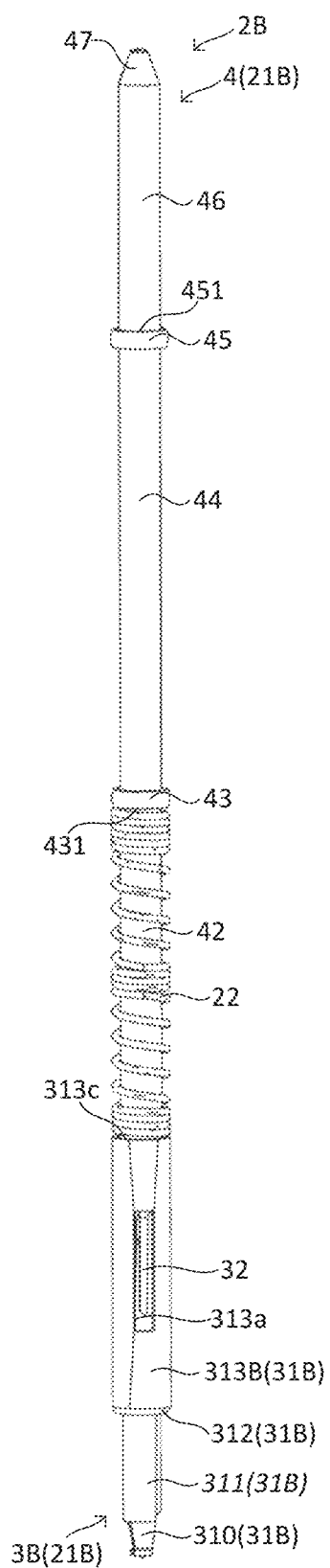
FIG. 6 is a side view of a contact pin according to Embodiment 2 of the present invention.
Figure 7:
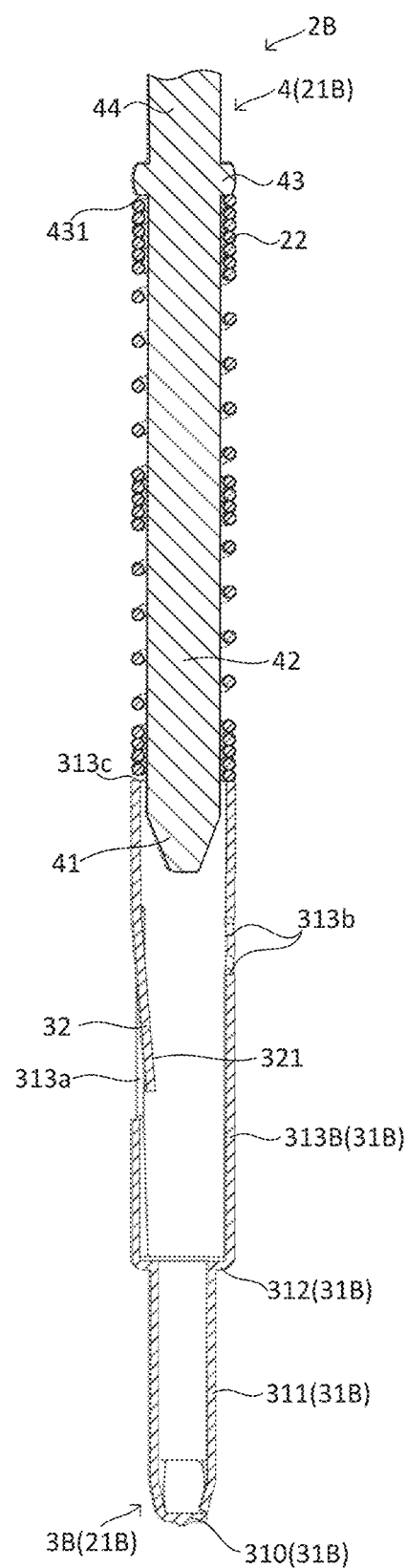
FIG. 7 is a cross-sectional view of the contact pin in a non-used state.
Figure 8:
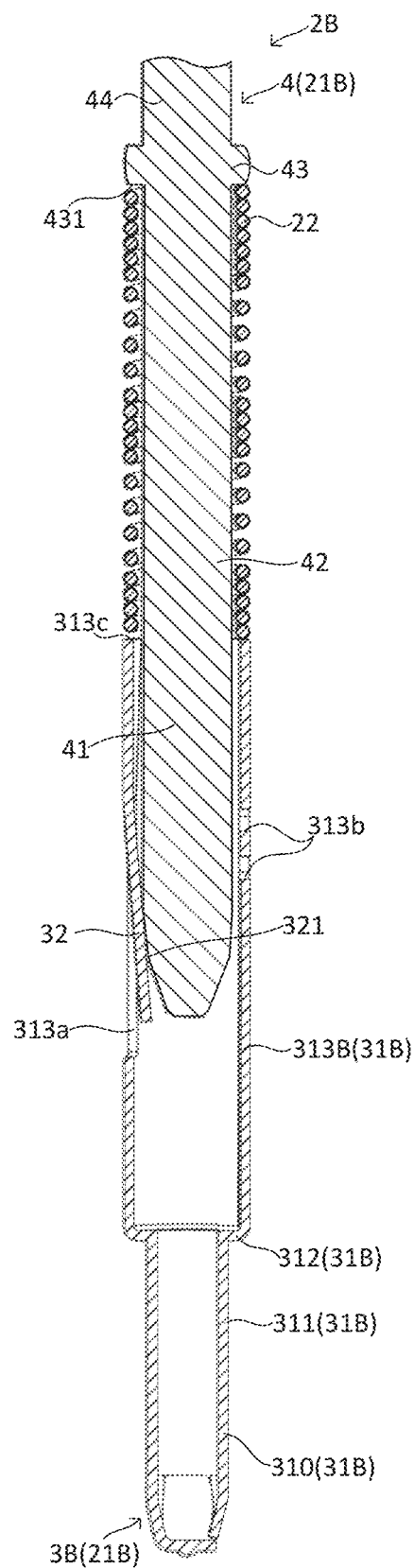
FIG. 8 is a cross-sectional view of the contact pin in a used state.

In the following, contact pin 2B according to Embodiment 2 of the present invention will be described with reference to FIGS. 6 to 8. The structure of a socket in the present embodiment is the same as that of socket S of Embodiment 1 described above except for contact pin 2B.

Contact pin 2B of the present embodiment includes pin body 21B and elastic member 22. The structure of elastic member 22 is the same as that of elastic member 22 of Embodiment 1 described above.

Pin Body

Pin body 21B includes first pin element 3B and second pin element 4 that are telescopically combined. Second pin element 4 is the same as second pin element 4 of Embodiment 1 described above.

First Pin Element

First pin element 3B corresponds to an exemplary outer pin element, and is made of a metal to give conductivity to the entire element. First pin element 3B includes main body portion 31B and pressing portion 32. The structure of pressing portion 32 is the same as that of pressing portion 32 of Embodiment 1 described above.

Main Body Portion

Main body portion 31B has a cylindrical shape. Main body portion 31B includes first terminal portion 310, first small diameter cylinder portion 311, first connection portion 312, and large diameter cylinder portion 313B in this order from the first end (lower end) side. The structures of first terminal portion 310, first small diameter cylinder portion 311, and first connection portion 312 are the same as those of first terminal portion 310, first small diameter cylinder portion 311, and first connection portion 312 of Embodiment 1 described above. Main body portion 31B having such a configuration does not include second connection portion 314 and second small diameter cylinder portion 315 in main body portion 31 in Embodiment 1 described above.

Large Diameter Cylinder Portion

Large diameter cylinder portion 313B has, for example, the shape of a cylinder whose outer diameter and inner diameter do not change over the entire length in the axial direction. The lower end of large diameter cylinder portion 313B is connected to first connection portion 312.

Large diameter cylinder portion 313B includes ring-shaped lower receiving surface 313c on its upper end surface. Lower receiving surface 313c is in contact with the lower end of elastic member 22. Lower receiving surface 313c is for receiving a downward elastic force applied from elastic member 22.

Elastic Member

Elastic member 22 is a coil spring, and is provided between first pin element 3 and second pin element 4. Elastic member 22 is for urging first pin element 3 and second pin element 4 in the direction in which pin body 21 is extended.

Specifically, elastic member 22 is provided so as to surround first shaft portion 42 of second pin element 4 in a non-used state. The lower end of elastic member 22 is in contact with lower receiving surface 313c in large diameter cylinder portion 313B of first pin element 3. The upper end of elastic member 22 is in contact with upper first receiving surface 431 in upper first receiving portion 43 of second pin element 4.

Contact pin 2B having such a configuration is held by holding portion 14 of support member 1. How contact pin 2B is supported by support member 1 in a used state and non-used state is the same as in Embodiment 1 described above. The operation of socket S is the same as that of socket S of Embodiment 1 described above.

Embodiment 3

Figure 9A:
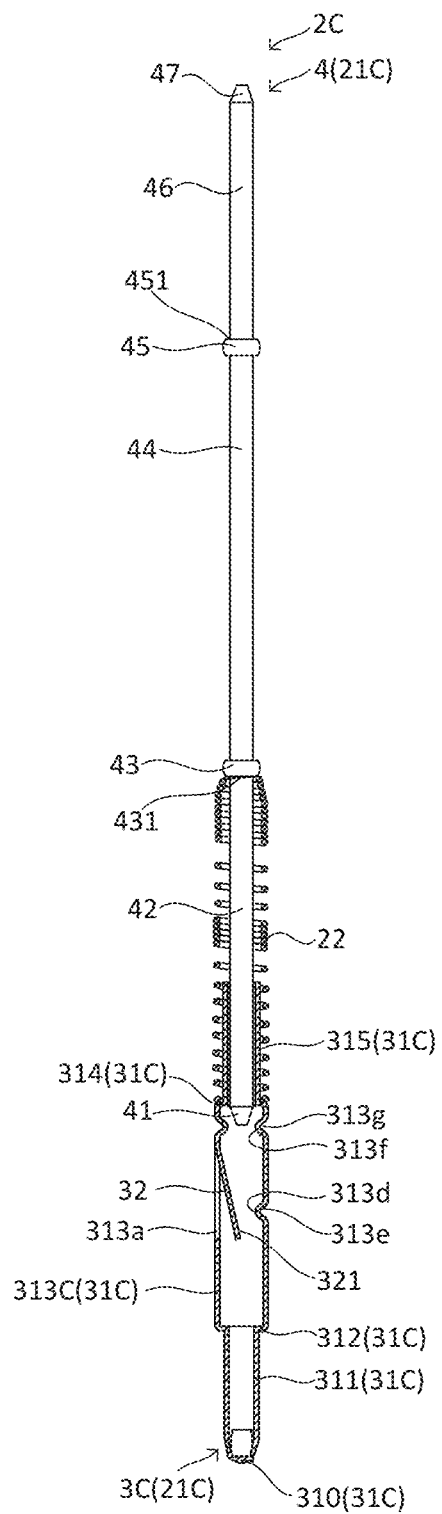
FIG. 9A is a cross-sectional view of a contact pin according to Embodiment 3 of the present invention in a non-used state.
Figure 9B:
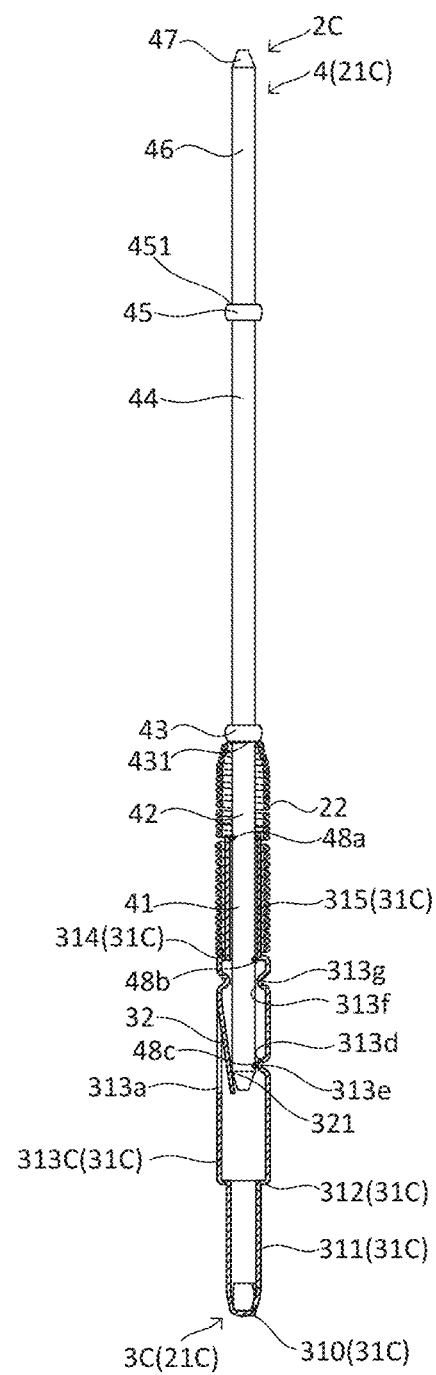
FIG. 9B is a cross-sectional view of the contact pin in a used state.

In the following, contact pin 2C according to Embodiment 3 of the present invention will be described with reference to FIGS. 9A and 9B. FIG. 9A is a cross-sectional view of contact pin 2C in a non-used state. FIG. 9B is a cross-sectional view of contact pin 2C in a used state. The structure of a socket in the present embodiment is the same as that of socket S of Embodiment 1 described above except for contact pin 2C.

Contact pin 2C of the present embodiment includes pin body 21C and elastic member 22. The structure of elastic member 22 is the same as that of elastic member 22 of Embodiment 1 described above.

Pin Body

Pin body 21C includes first pin element 3C and second pin element 4 that are telescopically combined. Second pin element 4 is the same as second pin element 4 of Embodiment 1 described above.

First Pin Element

First pin element 3C corresponds to an exemplary outer pin element, and is made of a metal to give conductivity to the entire element. First pin element 3C includes main body portion 31C and pressing portion 32. The structure of pressing portion 32 is the same as that of pressing portion 32 of Embodiment 1 described above.

Main Body Portion

Main body portion 31C has a cylindrical shape. Main body portion 31C includes first terminal portion 310, first small diameter cylinder portion 311, first connection portion 312, large diameter cylinder portion 313C, second connection portion 314, and second small diameter cylinder portion 315 in this order from the first end (lower end) side.

The structures of first terminal portion 310, first small diameter cylinder portion 311, first connection portion 312, second connection portion 314, and second small diameter cylinder portion 315 are the same as those of first terminal portion 310, first small diameter cylinder portion 311, first connection portion 312, second connection portion 314, and second small diameter cylinder portion 315 of Embodiment 1 described above.

Large diameter cylinder portion 313C has a cylindrical shape extending in the vertical direction. The lower end of large diameter cylinder portion 313C is connected to first connection portion 312. The upper end of large diameter cylinder portion 313C is connected to second connection portion 314 described below.

Large diameter cylinder portion 313C includes U-shaped slit 313a in the intermediate portion in the axial direction. The ends of slits 313a located at its top are separated from each other. The part surrounded by slit 313a is bent toward the inside of large diameter cylinder portion 313C to form pressing portion 32. The structure of slit 313a is the same as that of slit 313a of Embodiment 1 described above.

Large diameter cylinder portion 313C includes, on the inner peripheral surface thereof, lower protrusion 313d at a position opposite to slit 313a in the circumferential direction. Lower protrusion 313d projects radially inward from the inner peripheral surface of large diameter cylinder portion 313C. Lower protrusion 313d having such a configuration faces pressing portion 32 in the radial direction.

In addition, large diameter cylinder portion 313C includes, in the outer peripheral surface thereof, lower recess 313e at a part that faces lower protrusion 313d in the radial direction. Lower recess 313e is concave radially inward from the outer peripheral surface of large diameter cylinder portion 313.

In addition, large diameter cylinder portion 313C includes, on the inner peripheral surface thereof, annular upper protrusion 313f above the upper end of slit 313a. Upper protrusion 313f projects radially inward from the inner peripheral surface of large diameter cylinder portion 313C. Upper protrusion 313f is continuous over the entire circumference in the circumferential direction on the inner peripheral surface of large diameter cylinder portion 313C.

In addition, large diameter cylinder portion 313C includes, in the outer peripheral surface thereof, annular upper recess 313g at a part that faces upper protrusion 313f in the radial direction. Upper recess 313g is concave radially inward from the outer peripheral surface of large diameter cylinder portion 313C. Upper recess 313g is continuous over the entire circumference in the circumferential direction in the outer peripheral surface of large diameter cylinder portion 313C.

Other configurations of contact pin 2C are the same as those of contact pin 2 in Embodiment 1 described above.

In the present embodiment with the configuration described above, when IC package 5 housed in a socket is pressed downward by pressing member 71 (see FIG. 4C), the downward pressing force applied from pressing member 71 causes downward movement of movable portion 12 (see FIG. 4C) of support member 1 as well as IC package 5 (see FIG. 4C).

Subsequently, second terminal portion 47 of second pin element 4 is pushed downward by the package-side terminal of IC package 5. Then, the downward pressing force applied from IC package 5 causes downward movement of second pin element 4.

When second pin element 4 moves downward by a predetermined distance, pressed portion 41 of second pin element 4 contacts guide surface 321 in pressing portion 32 of first pin element 3C.

Guide surface 321 in pressing portion 32 of first pin element 3C is inclined in a direction approaching the central axis of contact pin 2 from the upper end to the lower end of the guide surface. Second pin element 4 thus receives force $F_1$ (see FIG. 4C) in the normal direction of guide surface 321 from pressing portion 32 of first pin element 3C.

This force $F_1$ includes force $F_2$ (see FIG. 4C), which is a component of the second direction orthogonal to the first direction in the axial direction. Force $F_2$ causes the change in the moving direction of second pin element 4 from the direction indicated by arrow $A_1$ in FIG. 4C to the direction indicated by arrow $A_2$ in FIG. 4C. As a result, second pin element 4 is inclined at a predetermined angle with respect to first pin element 3C.

In the present embodiment, when second pin element 4 is inclined with respect to first pin element 3C, upper contact position 48a and lower contact position 48c (the parts indicated by the black circles in FIG. 9B) in second pin element 4 come into contact with first pin element 3C. Upper contact position 48a is the same as upper contact position 48a of Embodiment 1 described above.

Also in the present embodiment, upper contact position 48a and lower contact position 48c are provided at first shaft portion 42 of second pin element 4. Upper contact position 48a is located above lower contact position 48c in first shaft portion 42 of second pin element 4. The phases of upper contact position 48a and lower contact position 48c are deviated from each other by 180° in the circumferential direction.

First shaft portion 42 may come into contact with upper protrusion 313f while second pin element 4 is inclined with respect to first pin element 3C. Also in the present embodiment, lower contact position 48b in second pin element 4 may come into contact with first pin element 3C while second pin element 4 is inclined with respect to first pin element 3C. The contact positions between first pin element 3C and second pin element 4 may be appropriately determined according to the shapes of first pin element 3C and second pin element 4.

In the present embodiment with the configuration described above, the number of positions where first pin element 3C and second pin element 4 come into contact with each other can be increased while second pin element 4 is inclined with respect to first pin element 3C. Therefore, the electrical connection between IC package 5 and inspection board 6 can be further stabilized.

This application is entitled to and claims the benefit of Japanese Patent Application No. 2020-21595 filed on Feb. 12, 2020, the disclosure of which including the specification, drawings, and abstract is incorporated herein by reference in its entirety.

INDUSTRIAL APPLICABILITY

The present invention is applicable for sockets for connecting various electric components.

REFERENCE SIGNS LIST

S Socket
1 Support member
11 Fixed portion
111 First plate
111a Through hole
111b Receiving surface
112 Second plate
112a Through hole
113 Third plate
113a Through hole
114 Fourth plate
114a Through hole
12 Movable portion
121 Through hole
13 Placement surface
14 Holding portion
2, 2B, 2C Contact pin
21, 21B, 21C Pin body
22 Elastic member
3, 3B, 3C First pin element
31, 31B, 31C Main body portion
310 First terminal portion
311 First small diameter cylinder portion
312 First connection portion
313, 313B, 313C Large diameter cylinder portion
313a Slit
313b Through hole
313c Lower receiving surface
313d Lower protrusion
313e Lower recess
313f Upper protrusion
313g Upper recess
314 Second connection portion
314a Lower receiving surface
315 Second small diameter cylinder portion
32, 32B, 32C Pressing portion
321, 321B Guide surface
33 First curved plate portion
331 First guide surface
34 Second curved plate portion
341 Second guide surface
4 Second pin element
41 Pressed portion
42 First shaft portion
43 Upper first receiving portion
431 Upper first receiving surface
44 Second shaft portion
45 Upper second receiving portion
451 Upper second receiving surface
46 Third shaft portion
47 Second terminal portion
48a Upper contact position
48b, 48c Lower contact position
5 IC package
6 Inspection board
7 Pressing device
71 Pressing member

The invention claimed is:

1. A contact pin configured to electrically connect a first electric component with a second electric component, the contact pin comprising:
a pin body including an inner pin element and an outer pin element that are disposed at one end side and an other end side in an axial direction and telescopically combined such that, when the pin body is retracted, the inner pin element moves in a retracting direction of the axial direction toward the other end side to decrease a length of protrusion of the inner pin element from the outer pin element, and, when the pin body is extended, the inner pin element moves in an extending direction of the axial direction toward the one end side to increase the length;
an elastic member including a contractible spring configured such that, when the pin body is retracted, the spring contracts to urge the inner pin element and the outer pin element to extend the pin body; and
a pressing portion that is provided in the outer pin element, that includes a contacting portion configured to contact the inner pin element when the pin body is retracted, and that is configured to apply a force via the contacting portion to the inner pin element moving in the retracting direction, the force containing a component in a direction orthogonal to the axial direction, wherein
the contacting portion of the pressing portion is disposed at a position which is spaced apart in the retracting direction from a forward end portion of the inner pin element in the retracting direction when the pin body is extended and the length is maximized.

2. The contact pin according to claim 1, wherein:
the pressing portion is provided integrally with the outer pin element.

3. The contact pin according to claim 2, wherein:
the pressing portion includes a plate-shaped member that has one end portion disposed on the one end side and connected to the outer pin element and an other end portion disposed on the other end side and provided with the contacting portion, the plate-shaped member extending from the one end portion to the other end portion to be inclined with respect to the axial direction such that a distance between the other end portion and a central axis of the outer pin element is smaller than a distance between the one end portion and the central axis.

4. The contact pin according to claim 3, wherein:
a cross section obtained by cutting the plate-shaped member by a plane passing through the central axis has a shape of a straight line or a curved line.

5. The contact pin according to claim 2, wherein:
the outer pin element includes a cylinder portion extending in the axial direction;

a part of the inner pin element is inserted into the cylinder portion; and the pressing portion is provided in the cylinder portion.

6. The contact pin according to claim 5, wherein:

the cylinder portion includes a small diameter cylinder portion and a large diameter cylinder portion connected to an end of the small diameter cylinder portion, the end being located on a side of the first direction; and the pressing portion is provided in the large diameter cylinder portion.

7. The contact pin according to claim 6, wherein:

the outer pin element includes an outer receiving surface between the small diameter cylinder portion and the large diameter cylinder portion;

the inner pin element includes, at an intermediate portion thereof in the axial direction, an inner receiving surface; and the elastic member is provided between the outer receiving surface and the inner receiving surface while surrounding the inner pin element.

8. The contact pin according to claim 2, wherein:

the outer pin element includes a protrusion at a position facing the pressing portion in a radial direction of the outer pin element.

9. A socket, comprising:

the contact pin according to claim 1; and a support member including a holding portion for holding the contact pin.

* * * * *